US012562687B2

(12) United States Patent
van der Heijden et al.

(10) Patent No.: US 12,562,687 B2
(45) Date of Patent: Feb. 24, 2026

(54) APPARATUS INCLUDING A BIAS VOLTAGE GENERATOR

(71) Applicant: NXP USA, INC., Austin, TX (US)

(72) Inventors: Mark Pieter van der Heijden, Eindhoven (NL); Christophe Cordier, Caen (FR); Rachid El Waffaoui, Eindhoven (NL)

(73) Assignee: NXP USA, Inc., Austin, TX (US)

( * ) Notice: Subject to any disclaimer, the term of this patent is extended or adjusted under 35 U.S.C. 154(b) by 742 days.

(21) Appl. No.: 17/822,489

(22) Filed: Aug. 26, 2022

(65) Prior Publication Data

US 2023/0096979 A1 Mar. 30, 2023

(30) Foreign Application Priority Data

Sep. 30, 2021 (EP) .................................... 21306365

(51) Int. Cl.
H03F 1/02 (2006.01)
G05F 3/26 (2006.01)
H03F 3/193 (2006.01)

(52) U.S. Cl.
CPC ........... H03F 1/0216 (2013.01); G05F 3/262 (2013.01); H03F 3/193 (2013.01); H03F 2200/451 (2013.01)

(58) Field of Classification Search
CPC .. H03F 1/0216; H03F 3/193; H03F 2200/451; H03F 2200/522; H03F 1/0261; H03F 3/245; H03F 1/22; H03F 1/52; H03F 3/195; H03F 1/30; G05F 3/262

USPC .......................................................... 330/296
See application file for complete search history.

(56) References Cited

U.S. PATENT DOCUMENTS

| | | | |
|---|---|---|---|
| 8,063,706 B2 | 11/2011 | Li et al. | |
| 10,243,519 B2 * | 3/2019 | Dykstra | ............... H03F 1/0227 |
| 10,673,388 B2 | 6/2020 | Van Der Heijden et al. | |
| 2006/0232341 A1 | 10/2006 | Iwata et al. | |
| 2012/0139635 A1 | 6/2012 | Ho et al. | |
| 2012/0139643 A1 | 6/2012 | Scott et al. | |

OTHER PUBLICATIONS

Datta, K., "Performance Limits, Design and Implementation of mm-Wave SiGe HBT Class-E and Stacked Class-E Power Amplifiers", IEEE Journal of Solid-State Circuits, vol. 49, No. 10, Oct. 2014.

(Continued)

*Primary Examiner* — Andrea Lindgren Baltzell
*Assistant Examiner* — Jose E Pinero

(57) ABSTRACT

An apparatus comprising: a cascode arrangement comprising two or more transistors, the cascode arrangement coupled between a supply voltage terminal for receiving a supply voltage from a battery and a ground terminal, and a bias voltage generator configured to provide a bias voltage to at least one of the two or more transistors of the cascode arrangement to bias the cascode arrangement, the bias voltage generator further configured to increase the bias voltage with increasing supply voltage at a first rate over a first supply voltage range and increase the bias voltage with increasing supply voltage at a second rate, greater than the first rate, over a second supply voltage range, wherein the second supply voltage range comprises a range of voltages greater than the first supply voltage range.

20 Claims, 4 Drawing Sheets

(56)          References Cited

OTHER PUBLICATIONS

Li, P., "High Efficiency Triple-Stacked Class-E Power Amplifier with Novel Dynamic Biasing Network", 2018 IEEE MTT-S International Wireless Symposium (IWS), May 6-10, 2018.
Ramirez-Angulo, J., "A Piecewise-Linear Function Approximation Using Current Mode Circuits", 1992 IEEE International Symposium on Circuits and Systems (ISCAS), May 10-13, 1992.

* cited by examiner

500

524   526   502   506   534

522

538

112   504

510

518

514

530   532   528   536   508

600

602

601

604

APPARATUS INCLUDING A BIAS VOLTAGE GENERATOR

CROSS-REFERENCE TO RELATED APPLICATIONS

This application claims the priority under 35 U.S.C. § 119 of European Patent application no. 21306365.4, filed on 30 Sep. 2021, the contents of which are incorporated by reference herein.

FIELD

The present disclosure relates to an apparatus comprising a cascode arrangement and a bias voltage generator. In particular, it relates to a cascode arrangement configured to receive its power from a battery and a bias voltage generator that is configured to provide a bias voltage for such a cascode arrangement.

BACKGROUND

Many battery powered devices make use of radio frequency (RF) amplifiers which include transistors. Amplifiers comprising transistors in a cascode arrangement may be used in such battery powered devices.

SUMMARY

According to a first aspect of the present disclosure there is provided an apparatus comprising, a cascode arrangement comprising two or more transistors, the cascode arrangement coupled between a supply voltage terminal for receiving a supply voltage from a battery and a ground terminal, and a bias voltage generator configured to provide a bias voltage to at least one of the two or more transistors of the cascode arrangement to bias the cascode arrangement, the bias voltage generator further configured to at least increase the bias voltage with increasing supply voltage at a first rate over a first supply voltage range and increase the bias voltage with increasing supply voltage at a second rate, greater than the first rate, over a second supply voltage range, wherein the second supply voltage range comprises a range of voltages greater than the first supply voltage range.

In one or more examples, the bias voltage generator is configured to apply the bias voltage to a first of the at least two transistors, wherein the first of the at least two transistors is also coupled to the supply voltage terminal, such as directly coupled.

In one or more examples, a boundary between the first supply voltage range and the second supply voltage range is within an operating range of voltages from the battery (may be including when the battery is being charged in some examples) and based on a property of at least one of the two or more transistors of the cascode arrangement.

In one or more examples, the cascode arrangement comprises two transistors comprising:

a first transistor having a first terminal, a second terminal and a control terminal, the first terminal configured to couple to the supply voltage terminal;

a second transistor having a first terminal, a second terminal and a control terminal, the first terminal coupled to the second terminal of the first transistor and the second terminal of the second transistor is configured to be coupled to the ground terminal; and wherein the bias voltage generator is configured to provide the bias voltage to the control terminal of the first transistor.

In one or more embodiments the cascode arrangement comprises at least three transistors comprising:

a first transistor having a first terminal, a second terminal and a control terminal, the first terminal of the first transistor configured to couple to the supply voltage terminal;

a second transistor having a first terminal, a second terminal and a control terminal, the first terminal of the second transistor coupled to the second terminal of the first transistor; and a third transistor having a first terminal, a second terminal and a control terminal, the first terminal of the third transistor coupled to the second terminal of the second transistor and the second terminal of the third transistor is configured to be coupled to the ground terminal; and wherein the bias voltage generator is configured to provide the bias voltage to one or both of the control terminal of the first transistor and the control terminal of the second transistor.

In one or more embodiments the bias voltage increases monotonically with respect to the supply voltage over the first supply voltage range.

In one or more embodiments the bias voltage increases monotonically with respect to the supply voltage over the second supply voltage range.

In one or more embodiments the first supply voltage range comprises a voltage range between 2V and 4V. In one or more embodiments the second supply voltage range comprises a voltage range above 3, 3.1, 3.2, 3.3, 3.4, 3.5, 3.6, 3.7, 3.8, 3.9 or 4V. In one or more examples the second supply voltage range comprises a voltage range above 4V or above 5V.

In one or more embodiments the first supply voltage range and the second supply voltage range are non-overlapping and contiguous with one another.

In one or more examples the supply voltage can be provided by a primary or a secondary battery. In one or more examples the supply voltage can be provided by a charging circuit for a secondary battery.

In one or more examples the first supply voltage range corresponds to a voltage range that includes a threshold voltage corresponding to a breakdown voltage of the transistor of the cascode arrangement to which the bias voltage is applied.

In one or more examples the first voltage range defines the voltage range over which the transistor or transistors of the cascode arrangement is/are biased to provide linear performance.

In one or more examples the second supply voltage range includes a voltage above a breakdown voltage of the transistor of the cascode arrangement to which the bias voltage is applied.

In one or more embodiments the bias voltage generator is configured to provide the bias voltage such that the voltage difference between the voltage at the supply voltage terminal and the bias voltage is below a predetermined threshold in at least the second supply voltage range.

In one or more examples the predetermined threshold is defined by the breakdown voltage of the transistor of the cascode arrangement to which the bias voltage is applied.

In one or more embodiments the bias voltage generator further comprises at least two current source arrangements, and wherein the at least two current source arrangements comprise:

a first current source arrangement configured to provide a first output current dependent on the supply voltage according to a first function; and a second current source arrangement configured to provide a second output current dependent on the supply voltage according to a second function, different to the first function; and the bias voltage generator further comprises a current to voltage converter configured to generate the bias voltage, wherein the bias voltage is based on a sum of the first current and the second current provided to the current to voltage converter by the at least two current source arrangements.

In one or more examples one or both of the at least two current source arrangements comprise a first current source and a second current source.

In one or more embodiments the first output current being dependent on the supply voltage according to the first function comprises the first current source arrangement being configured to provide the first output current such that it increases with increasing supply voltage. Thus, the first function may comprise a substantially linear function.

In one or more embodiments the second output current being dependent on the supply voltage according to the second function comprises the second current source arrangement configured to provide the second output current such that it increases with increasing supply voltage, wherein the second output current is only provided above a nominal level after a threshold supply voltage set point is reached, wherein the threshold supply voltage set point is greater than zero.

In one or more examples the first current source and the second current source of the first current source arrangement are configured to provide a first-output-current and a second-output-current, and wherein the first current source and the second current source of the second current source arrangement are configured to provide a third-output-current and a fourth-output-current.

In one or more examples the threshold supply voltage set point is above the first supply voltage range.

In one or more embodiments the first current source arrangement comprises a temperature dependent current source and a supply voltage dependent current source, configured to provide the first output current, and the second current source arrangement comprises a temperature dependent current source and a supply voltage dependent current source, configured to provide the second output current.

In one or more examples the first current source arrangement is a temperature dependent current source arrangement configured to provide the first output current, and the second current source arrangement is a supply voltage dependent current source arrangement configured to provide the second output current.

In one or more embodiments the first current source arrangement is configured such that the relationship between the first output current and the supply voltage is substantially linear, and the second current source arrangement is configured such that the relationship between the second output current and the supply voltage is substantially linear or non-linear.

In one or more examples the bias voltage generator may comprise:

a first resistive divider coupled between the supply voltage terminal and the ground terminal configured to provide a sense voltage at an output terminal of the first resistive divider;

a low drop out regulator coupled to the supply voltage terminal and having an output;

a second resistive divider coupled between the output of the low drop out regulator and the ground terminal and configured to provide a plurality of reference voltage outputs at a corresponding plurality of output terminals of the second resistive divider;

at least one current source arrangement comprising a first terminal and a second terminal, the first terminal of the at least one current source arrangement is coupled to the ground terminal;

at least one differential transistor pair comprising:

a first transistor having a first terminal, a second terminal and a control terminal, the first terminal of the first transistor configured to couple to output of the low drop out regulator, and the second terminal of the first transistor configured to be coupled to the second terminal of the at least one current source arrangement; the control terminal of the first transistor configured to be coupled to one of the plurality of reference voltage outputs;

a second transistor having a first terminal, a second terminal and a control terminal, the first terminal of the second transistor may be configured to be coupled to the output of the bias voltage generator and the second terminal of the second transistor is configured to be coupled to the second terminal of the at least one current source arrangement; the control terminal of the second transistor configured to receive the sense voltage.

In one or more embodiments the current to voltage converter comprises:

a resistor coupled between the control terminal of the first transistor of the cascode arrangement and the supply voltage terminal;

at least one transistor having a first terminal coupled to the control terminal of the first transistor of the cascode arrangement and a second terminal coupled to the ground terminal, and a control terminal; and wherein the output of the current to voltage converter is based on the voltage drop across the resistor and a base-emitter voltage of the at least one transistor of the current to voltage converter.

In one or more examples, a second resistor is coupled between the control terminal of the first transistor of the cascode arrangement and the control terminal of the at least one transistor of the current to voltage converter.

In one or more examples, the sum of the currents (e.g. first and second currents) provided by the current source arrangements to the current to voltage converter are provided to the control terminal of the at least one transistor of the current to voltage converter.

In one or more other examples, the at least one transistor of the current to voltage converter comprises a first transistor and the current to voltage converter comprises:

a third resistor; and a second transistor having a first terminal, a second terminal and a control terminal; wherein the third resistor is coupled between the control terminal of the first transistor of the current to voltage converter and a control terminal of the second transistor of the current to voltage converter; and the first terminal of the second transistor is coupled to the second terminal of the first transistor and the second terminal of the second transistor is coupled to the ground terminal, and the control terminal of the second transistor is coupled to receive the sum of the currents (e.g. first and second currents) provided by the current source arrangements.

In one or more examples the bias voltage generator may further comprise a first current mirror and a second current mirror, wherein the first current mirror and the second current mirror are configured to provide an output current based on the supply voltage (Vcc) being above the first supply voltage range.

In one or more embodiments the supply voltage is provided by a rechargeable battery.

In one or more examples there is provided the apparatus in combination with a rechargeable battery configured to provide the supply voltage at the supply voltage terminal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Amplifiers may be formed of transistors arranged in a stacked configuration, such as in a cascode arrangement or double cascode arrangement. Such amplifiers may be known as cascode amplifiers or, more generally, as a cascode arrangement and may be configured to amplify RF signals. In some devices, such as portable devices, these cascode arrangements may be battery powered. Examples of these devices can include cellular devices, Wireless Local Area Network, WLAN, devices and Bluetooth® powered devices amongst other portable radio frequency devices.

It is known that batteries can have a significant variation in their output voltage. The output voltage of a battery can be affected by several parameters such as the remaining charge in the battery, the temperature and the depth of discharge (DOD). A significant difference in output voltage of the battery can be observed even when comparing the voltage of a fully charged battery to that of a battery that has been partially discharged. Furthermore, rechargeable batteries can often be connected to a charging circuit for charging the battery whilst still being coupled to the cascode arrangement. Typically, portable devices have built-in batteries which remain coupled to the cascode arrangement during charging. Such portable devices can also be switched on whilst they are being charged. A charger for a rechargeable battery typically provides a voltage higher than that provided by the battery during normal operation in order to charge the battery. As a result, the cascode arrangement which is coupled to the battery can experience a very large voltage difference between the terminal that receives the supply voltage and one of its other terminals.

In some examples, the voltage difference across the terminal that receives the supply voltage and one other terminal of the cascode arrangement can be large enough to cause the semiconductor material of the transistor(s) that forms the cascode arrangement to breakdown, leading to undesired current flows and, in some examples, permanent damage. One or more examples disclosed herein may have improved ruggedness to ensure the cascode arrangement is resistant to damage during charging cycles or over a wider range of battery-supplied voltages.

Figure 1:
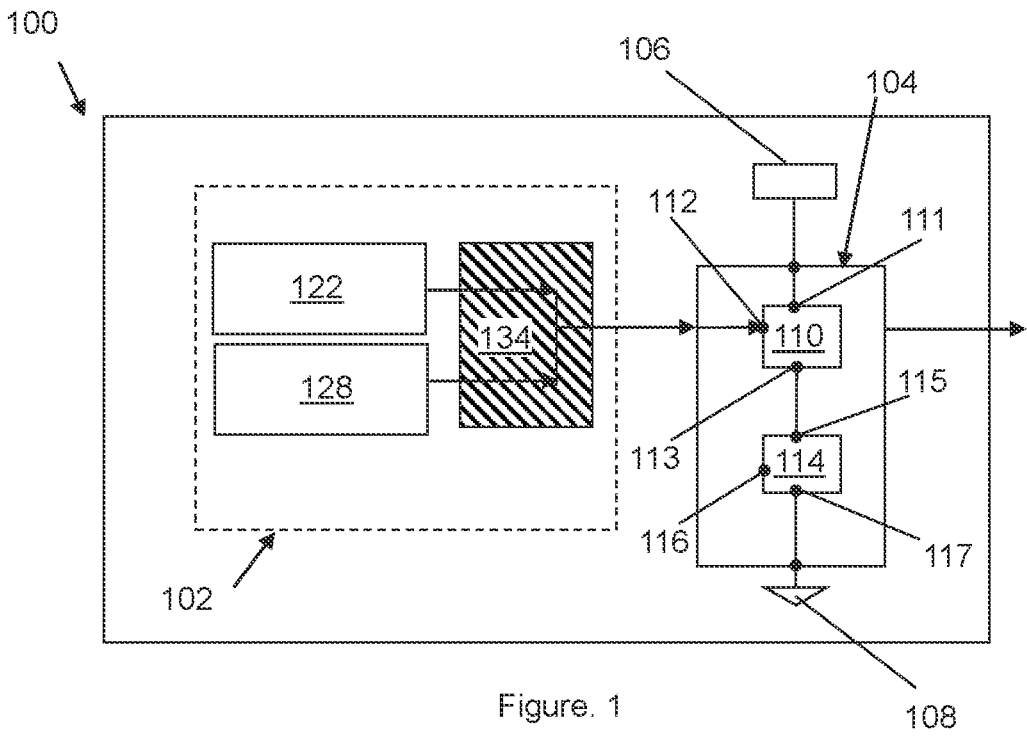
FIG. 1 shows a block diagram outlining an example embodiment of the apparatus comprising a cascode arrangement having two transistors and a bias voltage generator and, in addition, shows the general structure of the bias voltage generator.
Figure 2:
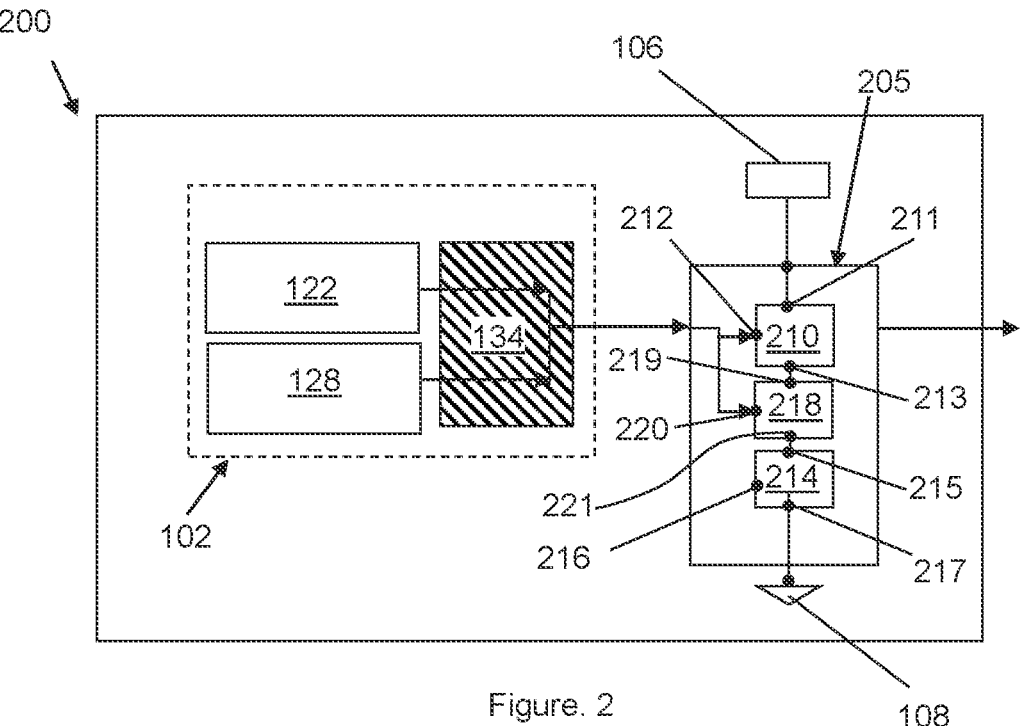
FIG. 2 shows a block diagram outlining an example embodiment of the apparatus comprising a cascode arrangement having three transistors and a bias voltage generator and, in addition, shows the general structure of the bias voltage generator.
Figure 3:
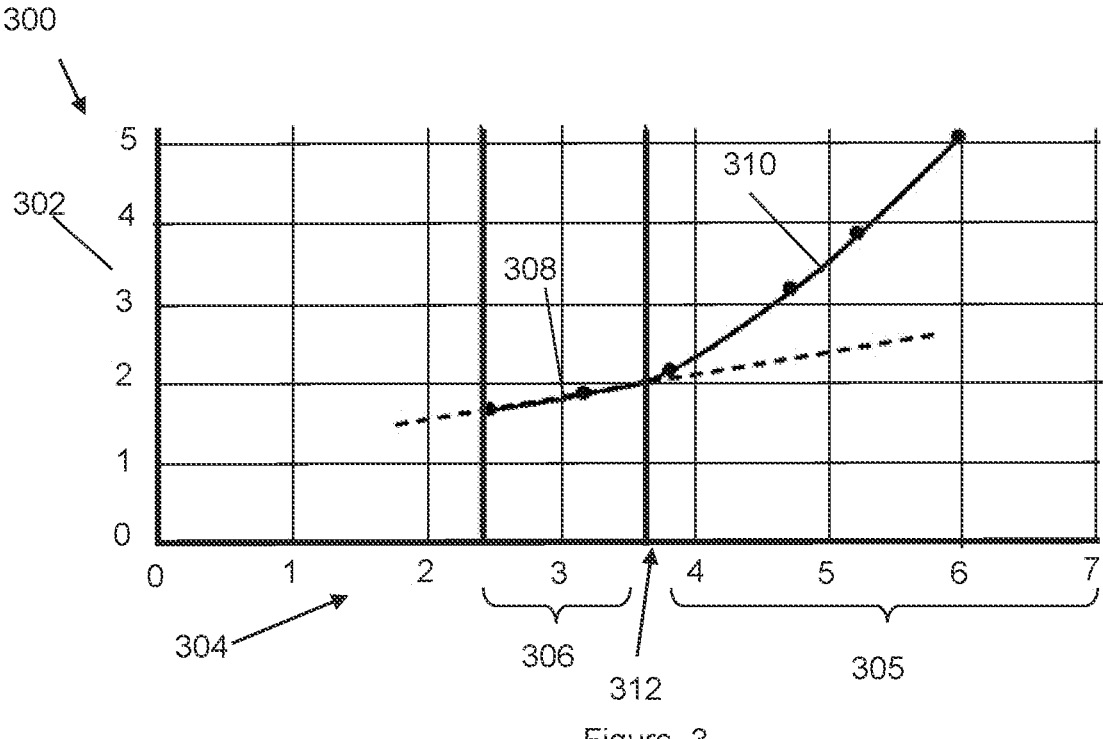
FIG. 3 shows an example of the bias voltage varying with increasing supply voltage as generated by the bias voltage generator in one example.

FIGS. 1 and 2 show an example of an apparatus 100, 200 comprising a bias voltage generator 102 configured to bias a cascode arrangement 104, 205. The cascode arrangement 104, of FIG. 1, comprises two transistors 110, 114 and the cascode arrangement 205, of FIG. 2, comprises three transistors 210, 218, 214. FIG. 3 shows an example plot of a bias voltage 300 generated by the bias voltage generator 102 in which the bias voltage 302 varies in response to the supply voltage 304 at different rates 308, 310 for different supply voltage ranges 305, 306, which can be applied to the cascode arrangement 104, 205 as will be described later.

The embodiments disclosed herein provide one or more examples in which the voltage difference between two terminals 111, 112 of the transistor 110 of the cascode arrangement 104 can be controlled by a bias voltage that is based on the supply voltage 304 to ensure the voltage difference is kept below a predetermined threshold, at least over a defined range of supply voltages (i.e. the supply voltage ranges 305, 306).

The cascode arrangement 104, 205 is coupled between a supply voltage terminal 106 and a ground terminal 108. The supply voltage terminal 106 is configured to be coupled to a battery when the apparatus 100 is in use. The ground terminal 108 is configured to be coupled to a reference voltage, such as ground, when the device is in use.

With reference to FIG. 1, the cascode arrangement 104 may comprise a first transistor 110 having a first terminal 111, a second terminal 113 and a control terminal 112, wherein the first terminal 111 is coupled to the supply voltage terminal 106. A second transistor 114 of the two transistors has a first terminal 115, a second terminal 117 and a control terminal 116, wherein the first terminal 115 is coupled to the second terminal 113 of the first transistor 110 and the second terminal 117 of the second transistor 114 is configured to be coupled to the ground terminal 108. The bias voltage generator 102 is configured to, in one or more examples, provide a bias voltage to the control terminal 112 of the first transistor 110.

In one or more examples, further transistors may form part of the cascode arrangement 205 as shown in FIG. 2 which comprises a three transistor cascode arrangement 205, as described below.

FIG. 2 shows an example embodiment in which cascode arrangement 205 comprises at least three transistors. In such an example, the cascode arrangement comprises a first transistor 210 having a first terminal 211, a second terminal 213 and a control terminal 212. The first terminal 211 of the first transistor 210 is configured to couple to the supply voltage terminal 106. A second transistor 218 has a first terminal 219, a second terminal 221 and a control terminal 220, wherein the first terminal of the second transistor 218 is coupled to the second terminal 213 of the first transistor 210. A third transistor 214 has a first terminal 215, a second terminal 217 and a control terminal 216. The first terminal 215 of the third transistor 214 is coupled to the second terminal 221 of the second transistor 218 and the second terminal 217 of the third transistor 214 is configured to be coupled to the ground terminal 108. The bias voltage generator 102 is configured to provide the bias voltage to one or both of the control terminal 212 of the first transistor 210 and the control terminal 220 of the second transistor 218. In some examples in which the both the first transistor 210 and second transistor 218 receive the bias voltage, then different bias voltages may be provided to each of them, but they may have the at least two rate form, shown generally in FIG. 3.

The transistors 110, 210, 114, 214 and 218 of the cascode arrangements 104, 205 may comprise bi-polar junction transistors or field effect transistors (FET). Accordingly, for a BJT, the first terminal comprises a collector terminal and the second terminal comprises an emitter terminal and the control terminal comprises a base terminal. For a FET, the first terminal comprises a source terminal and the second terminal comprises a drain terminal and the control terminal comprises a gate terminal.

In such cascode arrangements 104, 205 it is typically the first transistor 110, 210 which will experience the largest voltage difference between the supply voltage terminal 106 and the control terminal 112, 212. Thus, the bias voltage generator may be configured to apply the bias voltage to the first transistor 110 or 210.

FIG. 3 shows a graph 300 of a bias voltage generated by the bias voltage generator 102 which is applied to the cascode arrangement 104, 205. The horizontal axis of FIG. 3 shows the value of supply voltage 304 and the vertical axis shows the value of the bias voltage 302 which is determined as a function of the supply voltage 304.

The bias voltage generator 102 is configured to increase the bias voltage 302 with increasing supply voltage 304 at a first rate 308 over a first supply voltage range 306. The bias voltage generator 102 is configured to increase the bias voltage with increasing supply voltage at a second rate 310, greater than the first rate 308, over a second supply voltage range 305, wherein the second supply voltage range comprises a range of voltages greater than the first supply voltage range. Thus, the bias voltage formed by the first rate and the second rate may be considered as being a "dual slope bias voltage" as shown by the solid line in FIG. 3. The dashed line of FIG. 3 shows a single slope bias voltage for comparison.

Controlling the bias voltage 302 relative to the supply voltage 304 may have the advantage of reducing the voltage difference experienced between the first terminal 111, 211 and the control terminal 112, 212 of the first transistor 110, 210 of the cascode arrangement 104, 205 to below a threshold value. The threshold value may be based on or comprise a breakdown voltage of the first transistor 110, 210.

The battery which is coupled to the supply voltage terminal 106 may supply a voltage that varies from 2V to 6V in some examples. The upper voltage of the range may comprise the output voltage of the battery when it is fully charged, and the lower voltage may comprise the output voltage of the battery when it is at least partially discharged. In other examples, the supply voltage may range between 2.5V and 5.5V.

In practice, the cascode arrangement 104, 205 or "amplifier comprising a cascode arrangement" of a battery powered device may be optimized for operating at a nominal operating voltage of 3.8V. This corresponds to a nominal output voltage of a rechargeable battery. In other examples, the nominal output voltage is 5V, 12V or 2.5V, which may comprise a voltage-regulated output voltage. Thus, the transistors used within the cascode amplifier device are typically designed to operate optimally as this voltage. However, the transistors used in the cascode arrangement 104, 205 of battery operated devices need to be resilient against supply variations as high as 5.5V (and up to 6V). In other examples, the amplifier may be provided in combination with a supply modulator. Thus, the amplifier comprising the cascode arrangement, may use an average power or envelope tracking supply modulator to increase system efficiency, such as in a RF transmitter system. These systems may be configured to have various nominal (e.g. fixed) supply voltages (e.g. 2.5V, 5V, 12V). In some examples, the supply modulator may be configured to lower or increase the voltage when the transmitted RF (envelope) output power is low or high.

The first voltage range 306 may thus correspond to range of voltages provided by the battery from a fully charged state to a depleted state. In this first voltage range 306, the first rate 308 at which the bias voltage 302 is configured to increase with increasing supply voltage may be configured to provide for linear or substantially linear operation of the amplifier of which the cascode arrangement 104, 205 forms part.

The second supply voltage range 305 is higher than the first supply voltage range and may correspond to a range of voltages provided to the supply voltage terminal 106 by the battery between a voltage provided when it is fully charged to a higher voltage, such as the voltage applied to the battery by a charging circuit coupled to the battery and configured to charge the battery. In this second supply voltage range 305 the second rate 310 at which the bias voltage is configured to increase with increasing supply voltage may be configured to limit the voltage difference between the first terminal 111, 212 of the transistor 110, 210 that receives the supply voltage and the control terminal 112, 211 that receives the bias voltage. The first rate 308 may be less than 1 or less than 0.5 or substantially 0.

Thus, during the first voltage range 306, which may comprise a typical operating range of supply voltages provided by the battery, the bias voltage generator 102 is configured to bias the cascode arrangement 104, 205 (using the first rate 308) to maintain linearity. However, for higher supply voltages 305, the bias voltage generator 102 is configured to bias the cascode arrangement 104, 205 (using the second rate 310) to limit the collector-base voltage difference (for a BJT based cascode arrangement) or the source-gate voltage difference (for a FET based cascode arrangement) to below a threshold voltage over the second supply voltage range 305.

In one or more examples the first supply voltage range 306 and the second supply voltage range 305 are non-overlapping and contiguous with one another.

In one or more examples the first supply voltage range 306 may extend below a threshold value 312 for the supply voltage (i.e. a threshold supply voltage set point 312) based on or comprising a breakdown voltage of the transistor 110 of the cascode arrangement 104, 205 to which the bias voltage is applied. In one or more examples the second supply voltage range 305 may extend above the threshold value 312 for the supply voltage (i.e. a threshold supply voltage set point 312), which is based on or comprises the breakdown voltage of the transistor 110 of the cascode arrangement 104, 205 to which the bias voltage is applied. In some examples, the breakdown voltage may comprise, when the transistors comprise BJTs, a collector-base breakdown voltage with open emitter (known as BVCBO).

The second supply voltage range 305 in the example of FIG. 3 is shown as going up to a supply voltage 304 of 6V. However, this upper value can be higher or lower than 6V and depends on the type of battery and the output voltage of the corresponding charging circuit (not shown) used to charge the rechargeable battery.

In one or more examples the first supply voltage range 306 comprises a voltage range between 2V and 4V. In one or more examples the second supply voltage range 305 comprises a voltage range above 3.5V. In one or more examples the second supply voltage range 305 comprises a voltage range above 5V.

In one or more examples, the bias voltage 302 increases monotonically with respect to the supply voltage 304 over the first supply voltage range 306. In one or more examples, the bias voltage 302 increases monotonically with respect to the supply voltage 304 over the second supply voltage range 305. In one or more examples, the bias voltage 302 only increases with increasing supply voltage 304 (i.e., there are no plateaus along the bias voltage curve 300).

In some examples, the bias voltage provided over the first supply voltage range 306 may be nonlinear. In such an example, it will be appreciated that the first rate 308 comprises an average (e.g. mean) rate over the first supply voltage range 306 or, in other examples, the first rate comprises that rate provided at an upper bound of the first supply voltage range 306, such as the threshold 312. In some examples, the bias voltage provided over the second supply voltage range 305 may be nonlinear. In such an example, it will be appreciated that the second rate 310 comprises an average (e.g. mean) rate over the second supply voltage range 305.

It has been found that it is a particular challenge to configure a three transistor cascode arrangement 205 to perform linearly and without breakdown over the wide range of voltages typically provided by a battery. Thus, in one or more examples, use of the bias voltage generator 102 in combination with a three transistor cascode arrangement 205 may provide for a particularly effective cascode arrangement amplifier when the cascode arrangement 205 receives its supply voltage 304 from a battery (or other variable supply).

The control terminal 116, 216 of the second transistor 114, 214 of the cascode arrangement 104, 205 which is coupled to the ground terminal 108 is further configured to receive an input signal for amplification.

Figure 4:
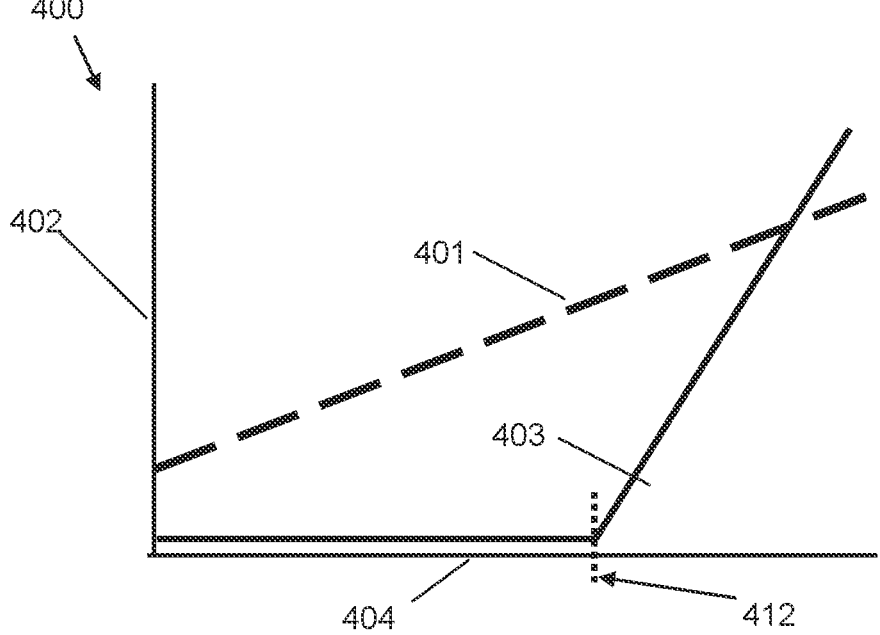
FIG. 4 shows an example of a first output current and a second output current provided by the first current source arrangement and the second current source arrangement of FIG. 1 or FIG. 2.

In the example of FIGS. 1 and 2, the bias voltage generator 102 may include a first current source arrangement 122 and a second current source arrangement 128. FIG. 4 shows an example of the output 400 from the two current source arrangements 122 and 128 of the bias voltage generator 102 of FIG. 1 and FIG. 2. The horizontal axis indicates a supply voltage 404 and the vertical axis indicates the output current 402. The current source arrangements 122, 128 may be configured to provide a first output current 401 and a second output current 403 respectively as shown in FIG. 4. In some examples the current source arrangements 122, 128, in combination, may be configured to provide the first output current 401 and the second output current 403. In some other examples the bias voltage generator 102 may comprise only one current source arrangement configured to provide an output current which varies with the supply voltage across the first supply voltage range 306 and the second supply voltage range 305.

FIG. 4 also shows a threshold supply voltage setpoint 412 at which the bias voltage generator is configured to change the bias voltage from being at the first rate 308 to the second rate 310 as shown in FIG. 3.

The first output current 401 is dependent on the supply voltage 404 according to a first function. The first output current comprises the first current source arrangement 122 being configured to provide the first output current such that it increases with increasing supply voltage 404. In this example, the first function is a substantially linear function and provides a positive current value at zero supply voltage, as represented by the positive intersection with the y-axis.

The second output current 403 is dependent on the supply voltage 404 according to the second function and comprises the second current source arrangement 128 configured to provide the second output current 403 such that it increases with increasing supply voltage 404, wherein the second output current is only provided when the supply voltage 404 is above a threshold supply voltage set point 412. In this example, the second function is also substantially linear.

In one or more examples the first current source arrangement 122 is configured such that the relationship between the first output current 401 and the supply voltage 404 is substantially linear, and the second current source arrangement 128 is configured such that the relationship between the second output current 403 and the supply voltage 404 is substantially linear above the threshold supply voltage set point 312, 412.

In one or more examples the threshold supply voltage set point 312, 412 is above the first supply voltage range 306. In one or more examples the threshold supply voltage set point 312, 412 may be set within the first supply voltage range 306. In one or more examples the threshold supply voltage set point 312, 412 may be set above the first supply voltage range 306.

With reference to FIG. 1, the bias voltage generator 102 further comprises a current to voltage converter 134. The current to voltage converter 134 is configured to generate the bias voltage 302 based on a sum of the first output current 401 and the second output current 403.

The sum of the two output currents 401, 403 will result in a dual slope relationship which will have a first slope during the first supply voltage range 306 and a second, different slope over the second supply voltage range 305 as shown in FIG. 3. The use of current source arrangements is advantageous in some examples because it is straightforward to sum the first output current and second output current to create the bias voltage using the current to voltage converter 134. In one or more examples the second output current 403 may be output for the entire (first and second) supply voltage ranges but may be substantially constant over the first supply voltage range 306 and increase over the second voltage range.

It will be appreciated that the value of the second rate 310 will be larger than the value of the first rate 308 as it will be based on a summation of the first output current 401 and the second output current 403.

In one or more examples the first current source arrangement 122 is a temperature dependent current source arrangement configured to provide the first output current 401. In one or more examples, the second current source arrangement 128 is a supply voltage dependent current source arrangement configured to provide the second output current 403. In one or more examples the first current source arrangement 122 may comprise a temperature dependent current source and a supply voltage dependent current source. In one or more examples the second current source arrangement 128 may comprise a temperature dependent current source and a supply voltage dependent current source. Thus, a combination of different types of current sources couped together may be configured to generate a current from which the bias voltage may be derived. While in this example the bias voltage is generated by the summation of currents from the current source arrangements, it will be appreciated that other ways of generating the multi-rate bias voltage is possible, such as by a programmable voltage source, which can be programmed to provide the at least two rates 308, 310.

Figure 5:
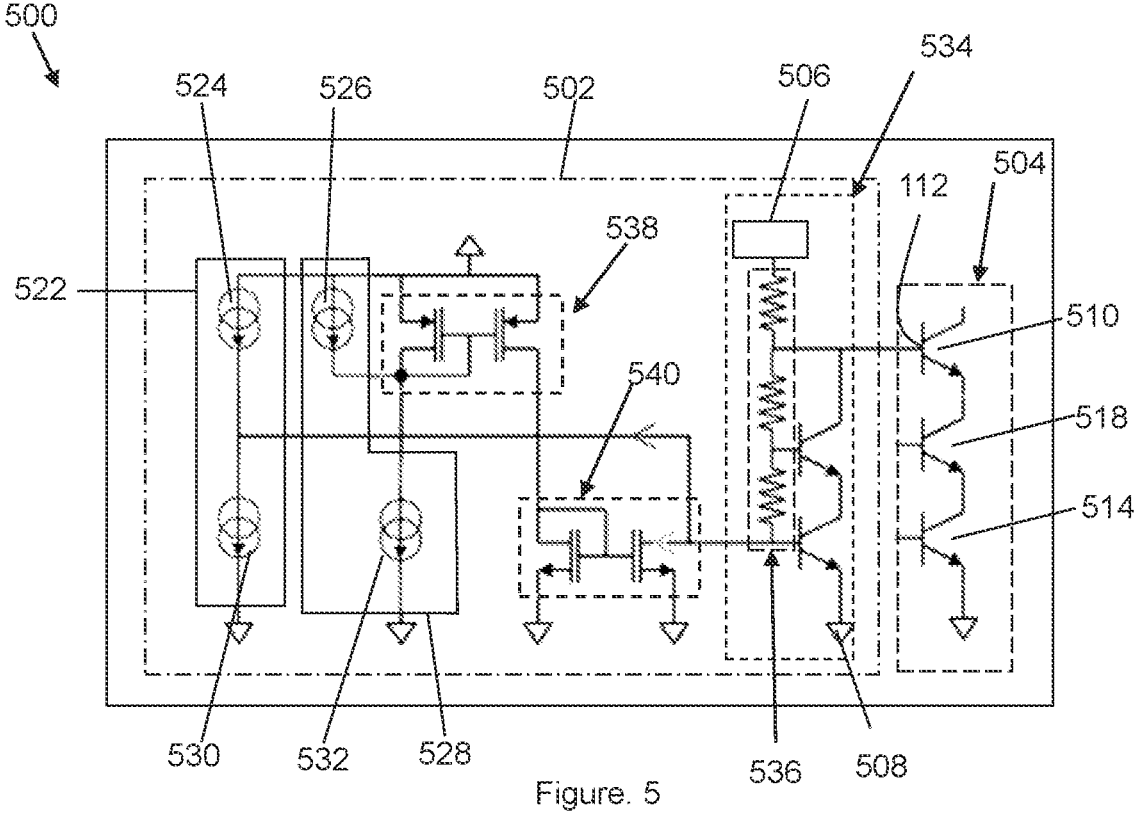
FIG. 5 shows an example embodiment wherein the bias voltage generator further comprises two current source arrangements according to a first embodiment.

FIG. 5 shows a further example embodiment of an apparatus 500 comprising a bias voltage generator 502 configured to bias a cascode arrangement 504. In this example, the first current source arrangement 522 comprises a first current source 524 and a second current source 530. The second current source arrangement 528 comprises a first current source 526 and a second current source 532. At least one of the first current source 524 and the second current source 530 of the first current source arrangement 522 is a temperature dependent current source (PTAT) and the other current source of the first current source 524 and the second current source 530 of the first current source arrangement 522 is configured to provide an output current proportional to the voltage at the supply voltage terminal 506. At least one of the first current source 526 and the second current source 532 of the second current source arrangement 528 is a temperature dependent current source (PTAT) and the other current source of the first current source 526 and the second current source 532 of the second current source arrangement 528 is configured to provide an output current proportional to the voltage at the supply voltage terminal 506.

In one or more examples the first current source arrangement 522 is configured to provide the first output current 401 as shown in FIG. 4. In one or more examples the first output current 401 is dependent on the supply voltage according to the first function, represented by the shape of the plot 401 in FIG. 4. In one or more examples the second current source 530 of the first current source arrangement 522 defines the slope for the first output current 401 in relation to the supply voltage 304. In one or more examples the first current source 524 of the first current source arrangement 522 defines the associated first output current 401 offset resulting in the first output current 401. Thus, in some examples the first output current 401 can be defined as having a linear relationship in which the output of the first current source 524 defines the slope and the output of the second current source 530 defines the value of the intersect with the vertical axis.

In one or more examples the first output current 401 varies with the supply voltage 304 in which a supply voltage of 0V results in an output current 402 of 0 mA and adding the current from the second current source 530 defines the value of the first output current 401 at a supply voltage of 0V.

In one or more examples the second current source arrangement 528 is configured to provide the second output current 403 dependent on the supply voltage according to the second function, represented by the shape of the plot 403 in FIG. 4. In one or more examples the second function is different to the first function. In one or more examples a ratio of the output of the first current source 526 of the second current source arrangement 528 and the output of the second current source 532 of the second current source arrangement 528 defines the threshold supply voltage set point 312, 412. Thus, a value of the current output by the first current source 526 of the second current source arrangement 528 and the value of the current output by the second current source 532 of the second current source arrangement 528 are compared and the ratio of these two current sources defines the threshold supply voltage set point 312, 412.

The bias voltage generated by the current to voltage generator 534 is based on a sum of the first output current 401 and the second output current 403 provided to the current to voltage converter 534 by the at least two current source arrangements 522, 528. In some examples the second output current 403 may be an exponential function such that it is substantially horizontal over the first supply voltage range and is configured to increase above the threshold supply voltage set point 312, 412.

In one or more examples, with the supply voltage being within the first supply voltage range 306, the current provided from the second current source arrangement 528 is blocked by a first current mirror arrangement 538. When the supply voltage 304 is in the first supply voltage range 306, the current from the first current source 526 of the second current source arrangement 528 is higher than or equal to the current from the second current source 532 of the second current source arrangement 528. The resulting current, which is a sum of the two currents, is a source current. In one or more examples a source current is established when the current from the first current source 526 of the second current source arrangement 528 is higher than or equal to the current from the second current source 532 of the second current source arrangement 528. In one or more examples the first current mirror 538 is configured to only conduct a sink current. Thus, in some examples, current mirror 538 will only conduct when the current from the first current source 526 of the second current source arrangement 528 is lower than the current from the second current source 532 of the second current source arrangement 528. Thus, the first current mirror 538 actively blocks the current from being provided to the current to voltage generator 534 when the supply voltage 304 is below the threshold supply voltage set point 312, 412.

In one or more examples, the first current mirror 538 is configured to only allow current to flow in one direction and so when the current from the first current source 526 of the second current source arrangement 528 is higher than the current from the second current source 532 of the second current source arrangement 528, the first current mirror 538 blocks the current flow.

In an example embodiment the bias voltage generator 502 further comprises a second current mirror 540. The second current mirror 540 is configured to sink the current.

In one or more examples, the first and second current mirrors 538, 540 are arranged to provide the output currents 403 and 401 as shown in FIG. 4. In one or more examples the current mirrors can also be used to further tune the rate 310 at which the bias voltage is increased in relation to the supply voltage 304 being in the second supply voltage range 305.

The use of current source arrangements 522, 528 and current mirrors 538, 540 offers the flexibility to control the different characteristics of the bias voltage 302 configured to be applied to the cascode arrangement 504. In one or more examples, the output current 401, 403 can be controlled by altering the number of individual current sources within each of the current source arrangements and selectively activating the current sources to provide the desired output current. In one or more examples the individual current sources which form each of the first current source arrangement 522 and the second current source arrangement 528 are connected in parallel and selectively coupled to the output to provide a controlled output current 401, 403. In one or more examples the first current mirror 538 and the second current mirror 540 are configured to provide an output based on the supply voltage 404 being above the threshold supply voltage set point 312, 412.

FIG. 5 also shows an example embodiment in which the current to voltage converter 534 is configured as a low impedance voltage source (in current sink mode). The low impedance voltage source is realised using a resistor chain 536 coupled between the supply voltage terminal 506 and the control terminal of a transistor of a cascode arrangement. The cascode arrangement is coupled between the control terminal 112 of the first transistor 510 of the cascode arrangement 504 and a ground terminal 508. The resistor coupled between the control terminal 112 of the cascode arrangement 504 and the supply voltage terminal 506 is a high-value pull-up resistor. In one or more examples the pull-up resistor is used to set the quiescent current through the cascode arrangement coupled between the control terminal 112 of the first transistor 510 of the cascode arrangement 504 and a ground terminal 508 and the remaining resistors of the resistor chain 536. In one or more examples the high-value pull-up resistor may have a value defined by the current required through the cascode arrangement coupled between the control terminal 112 of the first transistor 510 of the cascode arrangement 504 and a ground terminal. In one or more examples the output of the current to voltage converter 534 is defined by the base-emitter voltage of the lower transistor in cascode arrangement coupled between the control terminal 112 of the first transistor 510 of the cascode arrangement 504 and a ground terminal 508 and the voltage drop across the first two resistors of the resistor chain 536, which is controlled by the current sunk through the current mirror 540.

In one or more examples the output voltage of the current to voltage converter 534 is equal to the voltage across the pull-up resistor of the resistor chain 536 and the base-emitter voltage of the cascode arrangement coupled between the control terminal 112 of the first transistor 510 of the cascode arrangement 504 and a ground terminal 508. In one or more examples the base-emitter voltage of the transistors of the cascode arrangement coupled between the control terminal 112 of the first transistor 510 of the cascode arrangement 504 and a ground terminal 508 changes with temperature. In one or more examples the current source arrangements 522 and

528 are dependent on temperature, to compensate the voltage drift of the base-emitter voltage of the transistors in the cascode arrangement 504.

Figure 7:
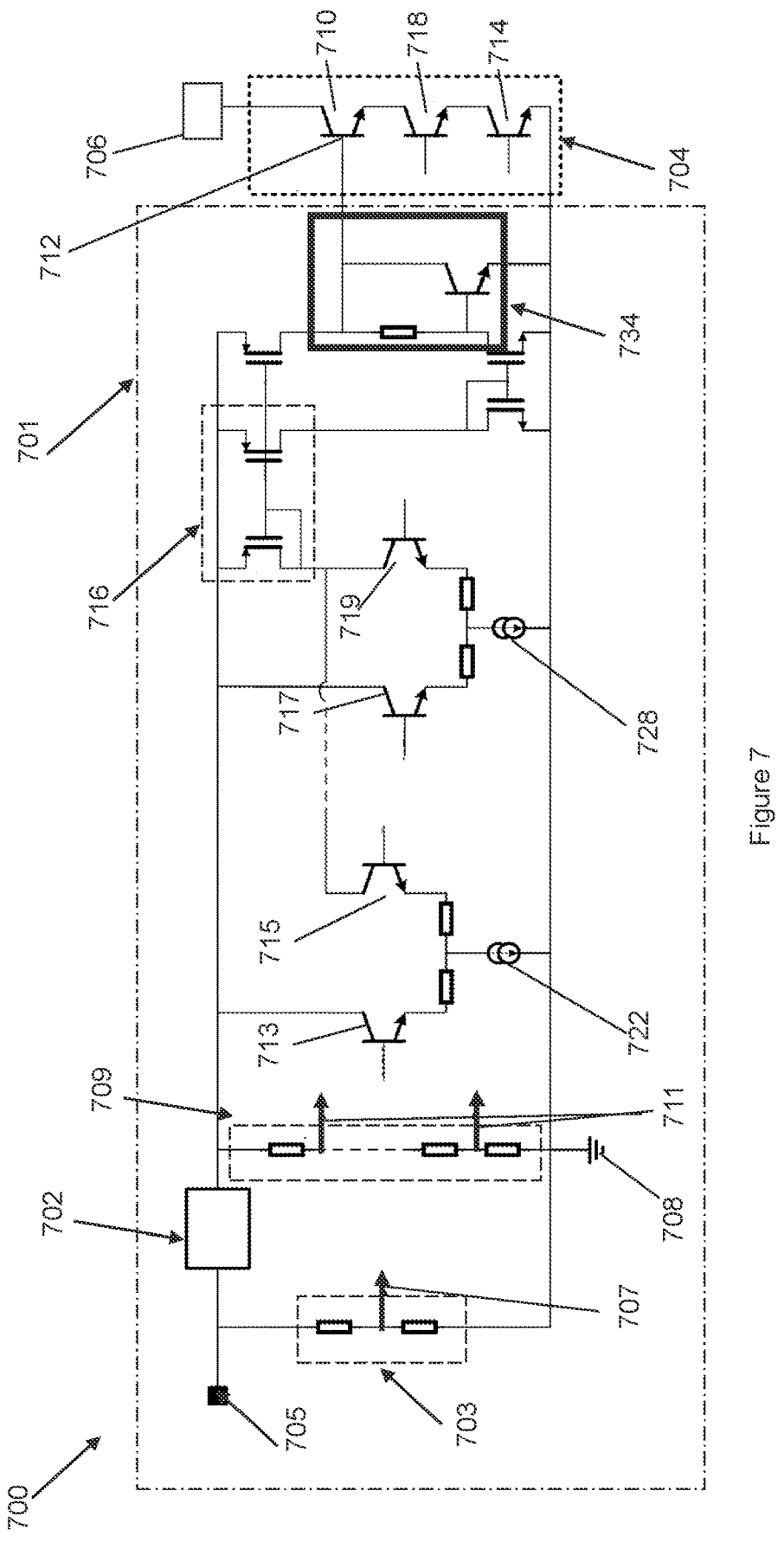
FIG. 7 shows an example of the apparatus according to the second embodiment.

FIG. 7 shows an example embodiment of a bias voltage generator 701 according to a second embodiment. The example in FIG. 7 comprises an N-slope bias voltage generator 701. The bias voltage generator 701 is based on a piece-wise-linear circuit controlled by the input supply voltage via a first resistive divider 703 coupled to a supply voltage input terminal 705 and constant reference voltages provided using a second resistive divider 709 coupled between an output of an internal low drop out regulator 702 and a ground terminal 708. An output terminal 707 of the first resistive divider 703 is connected to the base/control terminal of transistor devices 715, 719. While each output terminal 711 of the second resistive divider 709 is connected to the base/control terminal of transistor devices 713, 717.

The example embodiment in FIG. 7 further includes current sources 722, 728. The current sources 722, 728 have increasing weights (for example 1×, 2×, 4× . . . ) and determine the slopes of the bias voltage 601 shown in FIG. 6 to be applied to the control terminal(s) of the transistors of the cascode arrangement 704 as a function of the supply voltage 604 provided at the supply voltage terminals 705 and 706.

In some example embodiments the bias voltage generator 701 may further include additional resistors coupled to the emitter of the transistor devices 713, 715 and 717, 719. In some examples the additional resistors may be small degeneration resistors. These degeneration resistors may be configured to smoothen the current injected into the reference branch of the current mirror 716 as a function of the supply voltage 602.

Figure 6:
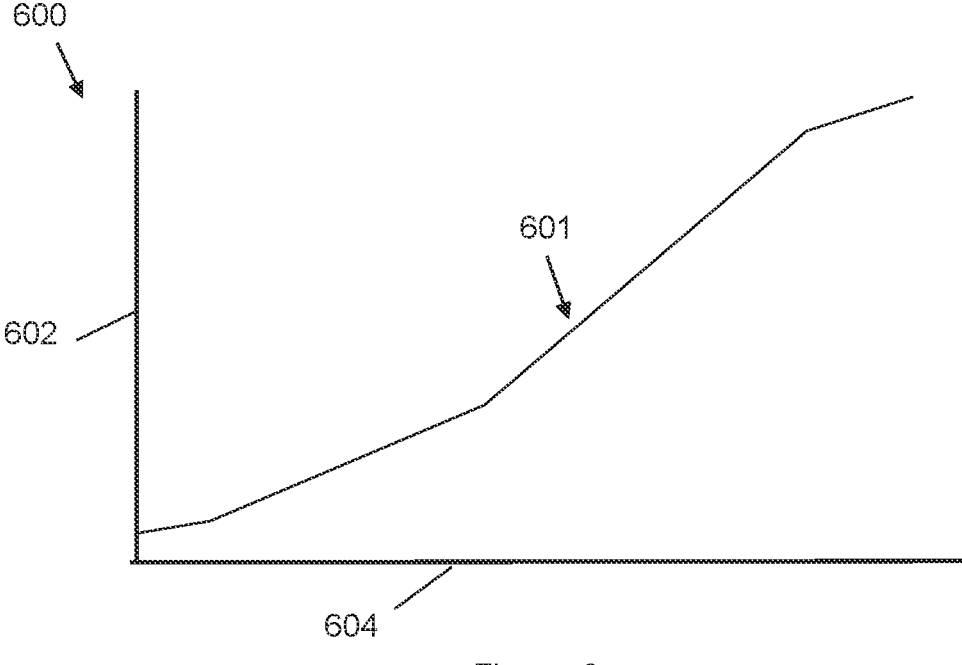
FIG. 6 shows an example of the bias voltage varying with increasing supply voltage as generated by the bias voltage generator according to a second embodiment.

FIG. 6 shows an example bias voltage 601 generated by the bias voltage generator 701 of FIG. 7.

The number of current sources used corresponds to the number of slopes that form the bias voltage signal as shown in FIG. 6. In the example of FIG. 6, three different slopes/rates have been implemented to generate the piece-wise linear bias voltage curve 601. It will be appreciated that any number of slopes can be used however this will increase the complexity of the bias voltage generator circuit 701 itself.

In some examples the current sources 722, 728 can be digitally controlled by software or by hardware to allow for better optimization and reliability in a real application. The voltage provided to the control terminal 112 of the first transistor 710 of the cascode arrangement 704 is given by the output of the current to voltage converter 734. In particular, by the base-emitter voltage of the transistor in the current to voltage converter 734 and the voltage drop across the resistor of the current to voltage converter 734.

In one or more examples the bias voltage generator may comprise a first resistive divider 703 coupled between the supply voltage terminal 705 and the ground terminal 708 configured to provide a sense voltage at an output terminal 707 of the first resistive divider 703. A second resistive divider 709 is coupled between the output of a low drop out regulator 702 and the ground terminal 708 and is configured to provide a plurality of reference voltage outputs at the output terminals 711 of the second resistive divider 709. At least one current source arrangement 722 comprising a first terminal and a second terminal, the first terminal of the at least one current source arrangement 722 is coupled to the ground terminal 708. The example of FIG. 7 comprises at least one differential transistor pair 713, 715. A first transistor 713 of the at least one differential transistor pair, has a first terminal, a second terminal and a control terminal, the first terminal of the first transistor 713 configured to couple to output of the low drop out regulator 702, and the second terminal of the first transistor configured to be coupled to the second terminal of the at least one current source arrangement 722. The control terminal of the first transistor is configured to be coupled to one of the plurality of reference voltage outputs 711. In one or more examples the control terminal of the first transistor is configured to be coupled to one of the plurality of reference voltage outputs 711 with the lowest value. A second transistor 715 of the at least one differential transistor pair has a first terminal, a second terminal and a control terminal. The first terminal of the second transistor may be configured to be coupled to the reference branch of the current mirror 716, which forms the output of the bias voltage generator 701 and the second terminal of the second transistor is configured to be coupled to the second terminal of the at least one current source arrangement 722. The control terminal of the second transistor is configured to receive the sense voltage.

A number of further transistor arrangement of similar construction, shown as transistors 717 and 719 in combination with current source 728, may be provided with each coupled to the reference branch of the current mirror 716 by the first terminal of the second transistor of the further transistor arrangement. It will be appreciated that the control terminal of each first transistor 717 of the number of further transistor arrangements receives a different one of the reference voltage outputs 711.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An apparatus comprising,
a cascode arrangement comprising two or more transistors, the cascode arrangement coupled between a supply voltage terminal for receiving a supply voltage from a battery and a ground terminal, and
a bias voltage generator configured to provide a bias voltage to at least one of the two or more transistors of the cascode arrangement to bias the cascode arrangement, the bias voltage generator further configured to at least increase the bias voltage with increasing supply voltage at a first rate over a first supply voltage range and increase the bias voltage with increasing supply voltage at a second rate, greater than the first rate, over a second supply voltage range, wherein the second supply voltage range comprises a range of voltages greater than the first supply voltage range.

2. An apparatus according to claim 1, wherein the cascode arrangement comprises at least three transistors comprising:
a first transistor having a first terminal, a second terminal and a control terminal, the first terminal of the first transistor configured to couple to the supply voltage terminal;
a second transistor having a first terminal, a second terminal and a control terminal, the first terminal of the second transistor coupled to the second terminal of the first transistor; and a third transistor having a first terminal, a second terminal and a control terminal, the first terminal of the third transistor coupled to the second terminal of the second transistor and the second terminal of the third transistor is configured to be coupled to the ground terminal; and wherein
the bias voltage generator is configured to provide the bias voltage to one or both of the control terminal of the first transistor and the control terminal of the second transistor.

3. An apparatus according to claim 2, wherein
the bias voltage increases monotonically with respect to the supply voltage over the first supply voltage range.

4. An apparatus according to claim 2, wherein
the bias voltage increases monotonically with respect to the supply voltage over the second supply voltage range.

5. An apparatus according to claim 2, wherein
the first supply voltage range comprises a voltage range between 2V and 4V.

6. An apparatus according to claim 2, wherein
the second supply voltage range comprises a voltage range above 3.5V.

7. An apparatus according to claim 1, wherein
the bias voltage increases monotonically with respect to the supply voltage over the first supply voltage range.

8. An apparatus according to claim 1, wherein
the bias voltage increases monotonically with respect to the supply voltage over the second supply voltage range.

9. An apparatus according to claim 1, wherein
the first supply voltage range comprises a voltage range between 2V and 4V.

10. An apparatus according to claim 1, wherein
the second supply voltage range comprises a voltage range above 3.5V.

11. An apparatus according to claim 1, wherein
the first supply voltage range and the second supply voltage range are non-overlapping and contiguous with one another.

12. An apparatus according to claim 1, wherein
the bias voltage generator is configured to provide the bias voltage such that the voltage difference between the supply voltage terminal and the bias voltage is below a predetermined threshold in at least the second supply voltage range.

13. An apparatus according to claim 1, wherein
the bias voltage generator further comprises at least two current source arrangements, and wherein
the at least two current source arrangements comprise:
a first current source arrangement configured to provide a first output current dependent on the supply voltage according to a first function; and
a second current source arrangement configured to provide a second output current dependent on the supply voltage according to a second function, different to the first function; and
the bias voltage generator further comprises a current to voltage converter configured to generate the bias voltage, wherein the bias voltage is based on a sum of the first current and the second current provided to the current to voltage converter by the at least two current source arrangements.

14. An apparatus according to claim 13, wherein
the first output current being dependent on the supply voltage according to the first function comprises the first current source arrangement being configured to provide the first output current such that it increases with increasing supply voltage.

15. An apparatus according to claim 13, wherein the second output current being dependent on the supply voltage according to the second function comprises the second current source arrangement configured to provide the second output current such that it increases with increasing supply voltage, wherein the second output current is only provided above a nominal level after a threshold supply voltage set point is reached, wherein the threshold supply voltage set point is greater than zero.

16. An apparatus according to claim 13, wherein the first current source arrangement comprises a temperature dependent current source and a supply voltage dependent current source, configured to provide the first output current, and the second current source arrangement comprises a temperature dependent current source and a supply voltage dependent current source, configured to provide the second output current.

17. An apparatus according to claim 13, wherein the first current source arrangement is configured such that the relationship between the first output current and the supply voltage is substantially linear, and the second current source arrangement is configured such that the relationship between the second output current and the supply voltage is substantially non-linear.

18. An apparatus according to claim 13, wherein the current to voltage converter comprises:

a resistor coupled between the control terminal of the first transistor of the cascode arrangement and the supply voltage terminal;

at least one transistor coupled between the control terminal of the first transistor of the cascode arrangement and the ground terminal; and wherein the output of the current to voltage converter is based on the voltage drop across the resistor and a base-emitter voltage of the at least one transistor of the current to voltage converter.

19. An apparatus according to claim 13, wherein the supply voltage is provided by a rechargeable battery.

20. An apparatus according to claim 1, wherein the supply voltage is provided by a rechargeable battery.

\* \* \* \* \*